(12) United States Patent
Zhao

(10) Patent No.: US 6,819,948 B2
(45) Date of Patent: Nov. 16, 2004

(54) SUPERCONDUCTING TAPES

(75) Inventor: Rupeng Zhao, Carlingford (AU)

(73) Assignee: Metal Manufacturers Limited, North Rocks (AU)

( * ) Notice: Subject to any disclaimer, the term of this patent is extended or adjusted under 35 U.S.C. 154(b) by 0 days.

(21) Appl. No.: 10/617,389

(22) Filed: Jul. 11, 2003

(65) Prior Publication Data

US 2004/0192557 A1 Sep. 30, 2004

Related U.S. Application Data

(63) Continuation of application No. 09/661,252, filed on Sep. 13, 2000, now abandoned, which is a continuation of application No. PCT/AU99/00181, filed on Mar. 18, 1999.

(30) Foreign Application Priority Data

Mar. 18, 1998 (GB) .................................. 9805641

(51) Int. Cl.[7] .......................... H01B 12/00; H01F 6/00; H01L 39/00
(52) U.S. Cl. ................. 505/231; 428/114; 428/930; 505/234
(58) Field of Search ................ 428/593, 606, 428/607, 673, 114, 212, 293.1, 379, 539.5, 930; 505/230, 231, 232, 234, 236, 237, 704; 174/125.1

(56) References Cited

U.S. PATENT DOCUMENTS

| | | | |
|---|---|---|---|
| 4,994,435 A | 2/1991 | Shiga et al. | |
| 5,059,582 A | * 10/1991 | Chung | ......................... 505/230 |
| 5,104,849 A | 4/1992 | Shiga et al. | |
| 5,122,507 A | 6/1992 | Yamamoto et al. | |
| 5,151,406 A | 9/1992 | Sawada et al. | |
| 5,189,260 A | 2/1993 | Finnemore et al. | |
| 5,192,739 A | 3/1993 | Lay | |
| 5,208,215 A | 5/1993 | Chen et al. | |
| 5,232,908 A | 8/1993 | Shiga et al. | |
| 5,288,699 A | 2/1994 | Sato et al. | |
| 5,347,085 A | * 9/1994 | Kikuchi et al. | ............. 505/231 |
| 5,360,784 A | 11/1994 | Kimura et al. | |
| 5,398,398 A | 3/1995 | Williams et al. | |
| 5,508,254 A | 4/1996 | Sato et al. | |
| 5,516,573 A | * 5/1996 | George et al. | ............. 428/143 |
| 5,516,753 A | 5/1996 | Ohkura et al. | |
| 5,801,124 A | 9/1998 | Gamble et al. | |
| 5,846,910 A | 12/1998 | Funahashi et al. | |
| 5,849,670 A | 12/1998 | Nabatame et al. | |
| 5,929,000 A | 7/1999 | Hahakura et al. | |
| 5,987,342 A | 11/1999 | Scudiere et al. | |

(List continued on next page.)

FOREIGN PATENT DOCUMENTS

| | | |
|---|---|---|
| EP | 0 282 286 A2 | 9/1988 |
| EP | 0 356 969 A2 | 3/1990 |
| EP | 0 357 779 A1 | 3/1990 |
| JP | 406309955 A | 11/1994 |
| JP | 410223070 A | 4/1998 |
| JP | 411025771 A | 1/1999 |
| JP | 411025772 A | 1/1999 |
| WO | WO 00/02208 | 1/2000 |
| WO | WO 01/71733 A1 | 9/2001 |

OTHER PUBLICATIONS

Abstract of Japanese Patent Publication No. 09259660; Oct. 3, 1997.

Primary Examiner—Steven Bos
Assistant Examiner—Colleen P. Cooke
(74) Attorney, Agent, or Firm—Fay Kaplun & Marcin, LLP

(57) ABSTRACT

A composite superconducting tape including a plurality of stacked and diffusion-bonded superconducting. Each of the superconducting tapes includes a filament of superconducting material in a silver-silver alloy cladding. Each of the superconducting tapes are an elongate component extending longitudinally.

12 Claims, 6 Drawing Sheets

U.S. PATENT DOCUMENTS

| | | |
|---|---|---|
| 6,074,991 A | 6/2000 | Jenovelis et al. |
| 6,110,873 A | 8/2000 | Duperray et al. |
| 6,192,573 B1 | 2/2001 | Hahakura et al. |
| 6,271,474 B1 | 8/2001 | Fujikami et al. |
| 6,272,730 B1 | 8/2001 | Gherardi et al. |
| 6,272,731 B1 | 8/2001 | Leriche et al. |
| 6,284,979 B1 | 9/2001 | Malozemoff et al. |
| 6,305,069 B1 | 10/2001 | Fujikami et al. |
| 6,344,430 B1 | 2/2002 | Duperray et al. |
| 6,349,226 B1 * | 2/2002 | Yoshino et al. ............. 505/230 |
| 6,360,425 B1 | 3/2002 | Christopherson et al. |
| 6,370,405 B1 | 4/2002 | Riley, Jr. et al. |
| 6,381,832 B1 | 5/2002 | Kaneko |
| 6,387,852 B1 | 5/2002 | Celik et al. |
| 6,442,827 B1 * | 9/2002 | Herrmann et al. ............ 29/599 |
| 6,444,917 B1 * | 9/2002 | Scudiere et al. ......... 174/125.1 |
| 6,466,805 B2 | 10/2002 | Balachandran et al. |
| 6,469,253 B1 | 10/2002 | Saga et al. |
| 6,507,746 B2 * | 1/2003 | Kaneko ...................... 505/231 |
| 6,600,939 B1 * | 7/2003 | Zhao .......................... 505/231 |
| 6,642,182 B2 * | 11/2003 | Kaneko ...................... 505/431 |

* cited by examiner

SUPERCONDUCTING TAPES

CROSS REFERENCE TO RELATED APPLICATIONS

This is a continuation application of application Ser. No. 09/661,252 filed Sep. 13, 2000 now abandoned, which is a continuation of application Ser. No. PCT/AU99/00181, filed Mar. 18, 1999, the entire contents of which are hereby incorporated by reference for all purposes, and which claims foreign priority under 35 U.S.C. 119 to British Application 9805641.9 filed Mar. 18, 1998.

FIELD OF THE INVENTION

The present invention relates to a superconducting tape and in particular to a composite superconducting tape.

The invention has been developed primarily for use with high load current carrying cables and will be described hereinafter with reference to that application. It will be appreciated, however, that the invention is not limited to this particular field of use.

BACKGROUND OF THE INVENTION

It is known to use superconducting tapes to make coils, magnets, transformers, motors and generators as well as current carrying cables. Superconductors are materials which exhibit, at sufficiently low temperatures, substantially zero electrical resistance for direct current. The temperature at which a substance becomes superconducting is called the transition or critical temperature. Early superconductors had critical temperatures that necessitated refrigeration with liquid helium. However, due to low thermodynamic efficiency, this is an expensive an generally uneconomic arrangement. More recently it has been known to utilise "ceramic" superconductors with critical temperatures up to around 135K.

Superconductors with critical temperatures over 77K are of particular interest as they can be operated with liquid nitrogen refrigeration at relatively high thermodynamic efficiency and relatively low cost.

Superconductors can only carry so much current before the voltage drop per unit of length begins to increase in an exponential form. The so called "critical" current, $I_c$, is defined for precision as the maximum current that can be carried before the voltage drop increases above 1 microvolt per centimeter.

Tapes comprising superconducting material, and referred to as superconducting tapes, are already known, and comprise one or many superconducting filaments in a medium of silver or silver alloy. The main class of superconducting tape are known as powder-in-tube or PiT tape. These are made by drawing or otherwise reducing a tube of silver or silver alloy filled with a powder form of the superconducting oxide or its precursor. The tubes are also rolled or otherwise formed into a thin tape.

Multifilamentary tapes are mostly made by grouping filled tubes in a common silver or silver alloy sheath at art intermediate stage of reduction.

One important superconducting oxide is known as Bi-2223, and is a compound oxide of bismuth, strontium, calcium and copper. Certain limited substitutions can be made, as required. Bi-2223 can also be considered a cuprate salt.

Known tapes usually have a thickness of between around 0.2 mm and 0.3 mm, and a width of between 2 mm and 5 mm. The superconducting filaments must be thin to obtain an adequate critical current and are typically around 10 to 40 microns in thickness. Moreover, the filaments typically have an aspect ratio of at least 1:10.

The filaments comprise many plate-like grains and, for good performance, the grains should be aligned as much as possible in the same crystallographic orientation. The relative orientation is often referred to as the grain alignment or "texture". Well textured filaments allow a high critical current, and give overall flexibility to the whole tape. If the filaments are too thick, then they will degrade at relatively large bending radii of the tape.

A superconducting tape's flexibility can be measured in terms of the reversible bending radius achievable when such bending is carried out at room temperature. The reversible bending radius may be defined as the largest bending radius which causes more than 5% degradation in the critical current, Ic, as measured on the unstrained tape. Other criteria which are used to define the quality of the tape and the amount of current that a superconducting tape can carry is the critical current density, $J_c$, and the engineering current density, $J_e$. The critical current density, $J_c$, is defined by $J_c = I_c/A_{sc}$ where $A_{sc}$ is the total superconductor area in the cross-section of the tape, and the engineering current density $J_e$ is defined by $J_e = I_c/A_{tape}$, where $A_{tape}$ is the total cross-sectional area of the tape. The higher $J_c$ and $J_e$ the better. The ratio of the cross-sectional area of the superconductor to the cross-sectional area of the whole tape is called the Fill Factor, FF, and, therefore, we can deduce that $FF = J_e/J_c$.

When tapes are used to carry alternating current, rather than direct current, the superconducting tapes do not exhibit zero power loss, though losses are small compared to those exhibited by normal metallic conductors. This power loss resulting from the carrying alternating current rather than direct current is called "AC loss".

For an individual tape, the AC loss can be of the order of 100 microwatts per meter per Amp of critical current squared. To achieve the maximum performance from these tapes the AC losses should be minimised. This is particularly true when they are used in superconducting cables where the current loads are high.

Composite tapes are sometimes made by forming a stack of individual tapes and wrapping the stack with one or more flexible wrapping tapes to keep it together. These wrapping tapes are generally a metal and more often silver.

Inevitably there are some gaps and/or overlapping between the turns of the wrapping tape. If such a wrapped stack were to be rolled then the gaps or overlapping would create kinks in the filaments, which destroys local grain alignment leading to degradation of the overall critical current density $J_c$.

It is an object of the present invention, at least in the preferred embodiment, to overcome or substantially ameliorate one or more of the disadvantages of the prior art, or at least to provide a useful alternative.

DISCLOSURE OF THE INVENTION

According to a first aspect of the invention there is provided a composite superconducting tape comprising a multiplicity of stacked and diffusion bonded superconducting tapes in which all elongate components extend longitudinally and a compatible metal tape is bonded to at least one exposed major surface.

The preferred embodiments of the invention making use of the combination described above to achieve a tape of high superconductor cross-sectional area and A thin and wide filament structure. This is highly desirable for a high critical current density.

Preferably, the filament thickness is as thin as is required to provide a desired critical current density, wherein the fill factor of the tape is about 40%.

Preferably also, the composite tape consists solely of the stacked and bonded constituent tapes. The composite tape has exposed major surfaces which are defined by those surfaces of the constituent tapes which are not abutted against an adjacent surface. More preferably, the exposed major surfaces of the composite tape covered with a metal. More preferably, the tape is of silver or silver alloy. In other embodiments, metal tapes other than those of silver are used.

In a preferred form, the superconductor filaments are at least 10 $\mu$m away from the exposed major surfaces. More preferably, use is made of the thin metal tape to allow this to be achieved without incorporating unnecessary amounts of silver elsewhere in the composite tape.

Preferably also, the metal tape is used to control mechanical stresses. More particularly, some composite tapes are intended, in use, to be curved always in one direction such that one of the major exposed surfaces will always be convex and the opposed major exposed surface will always be concave. In such circumstances a metal tape is applied to the major surface that will be convex. More preferably, the major side that will be concave either does not include a metal tape or includes a second metal tape that is weaker than the first metal tape. In some embodiments the stronger tape is a silver alloy tape and the weaker tape a pure silver tape. In other embodiments the tapes differ in thickness.

Preferably, the metal tape is flat has a width not substantially greater than that of the superconducting tapes. In some embodiments the metal tape has a width of less than the superconducting tapes. In still further embodiments a wider metal tape is used which is, or subsequently becomes, bent to a channel section. The latter arrangement has structural advantages but adversely affects fill factor. Other embodiments utilise a silver foil or other compatible material which is wrapped around the stack but extending longitudinally.

Preferably, the constituent tapes are stacked in a single stack or in two or more parallel adjacent stacks. The latter normally requires one or two full width metal tapes to bridge from stack to stack. However, in some embodiments that bridging is achieved by one or two full width superconducting tapes. Structures with exactly two parallel stacks appear from preliminary experiments to have superior AC loss characteristics.

Preferably also, diffusion bonding between the superconducting tapes and metal tapes, if present, is obtained by assembling the tapes face to face and then heat treating them at a temperature at which diffusion between the metals occurs. However, it has been found that the temperature should be well controlled to minimise any deleterious effect on the superconducting material.

Good diffusion bonding between silver occurs at temperatures above 600° C. When the superconducting material has a typical BSCCO-2223 composition, bonding temperature should not exceed 842° C.; and should not be around 780° C., at which rapid formation of detrimental secondary phases occurs. With this example, the preferred bonding temperature is in the range of 815° C. to 825° C.

More preferably, the bonding is performed at a temperature below 700° C. in an inert atmosphere or in a vacuum to avoid oxidation of the metal sheaths during the bonding process. Although a diffusion time of several hours will be required to achieve adequate bonding it is preferred to avoid excessively long diffusion times as they tend to produce too much sintering of the superconductor material.

Preferably, the diffusion bonded stack of tapes is rolled to reduce overall thickness and to strengthen the bonding.

According to another aspect of the invention there is provided a method of making a composite superconducting tape, the method comprising the steps of:
stacking a multiplicity of constituent monofilamentary or multifilmentary superconducting tapes together;
heat treating the stack of superconducting tapes to promote diffusion bonding; and
rolling the diffusion bonded stack.

According to another aspect of the invention there is provided a composite superconducting tape constructed from a plurality of elongate superconducting tapes which each include at least one major surface, the composite superconducting tape including:
a diffusion-bonded stack of the plurality of superconducting tapes in which all elongate components extend longitudinally and in which at least one of the major surfaces is exposed; and
a compatible metal tape that is bonded to the exposed major surface.

Preferably, the plurality of superconducting tapes each include at (east one superconductive filament and an outer casing of pre dominantly silver for both containing the filaments and defining the major surface, the metal tape including a first surface for abutting the at least one exposed major surface and a second surface opposite the first surface. More preferably, the metal tape is silver and the distance between the second surface and the closest filament of the adjacent superconducting tape is at least 10 $\mu$m.

Preferably also, the stack includes a second exposed major surface and the composite superconductor tape includes a second compatible metal tape which is bonded to the second exposed major surface. More preferably, the metal tapes differ in at least one characteristic. Even more preferably, the differing characteristic is chosen from the set consisting of: thickness; strength; rigidity; width; and coefficient of thermal expansion.

In a preferred form, the composite superconducting tape includes a second diffusion-bonded stack having a plurality of superconducting tapes, wherein the two stacks are maintained in a substantially parallel configuration.

Preferably, the metal tape is diffusion bonded to the exposed major surface.

Unless the context clearly requires otherwise, throughout the description and the claims, the words 'comprise', 'comprising', and the like are to be construed in an inclusive sense as opposed to an exclusive or exhaustive sense; that is to say, in the sense of "including, but not limited to".

BRIEF DESCRIPTION OF THE DRAWINGS

Preferred embodiments of the invention will now be described, by way of example only, with reference to the accompanying drawings in which.

PREFERRED EMBODIMENT OF THE INVENTION

Figure 1:
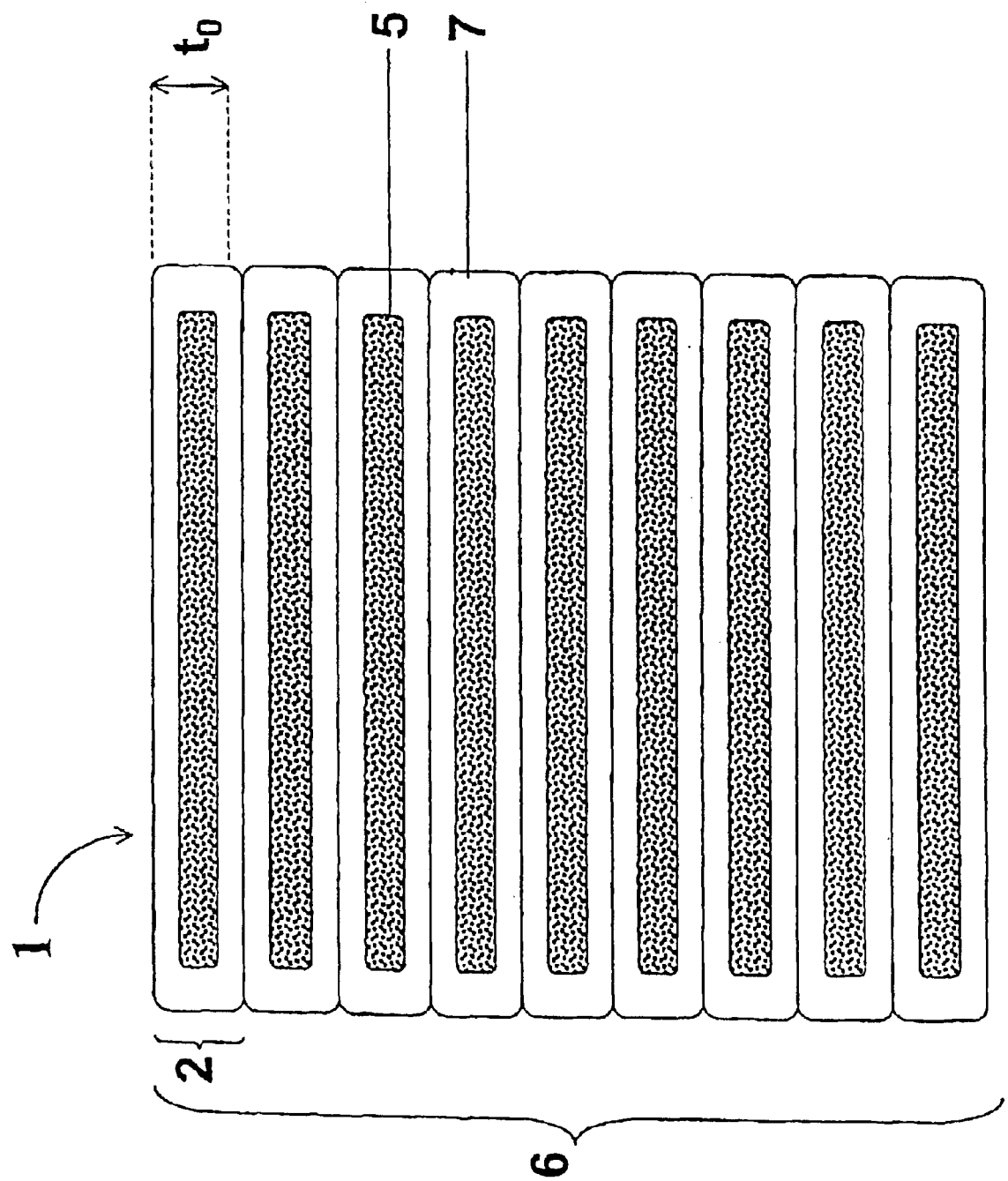
FIG. 1 is a schematic cross-section of a composite superconducting tape according to the invention.
Figure 2:
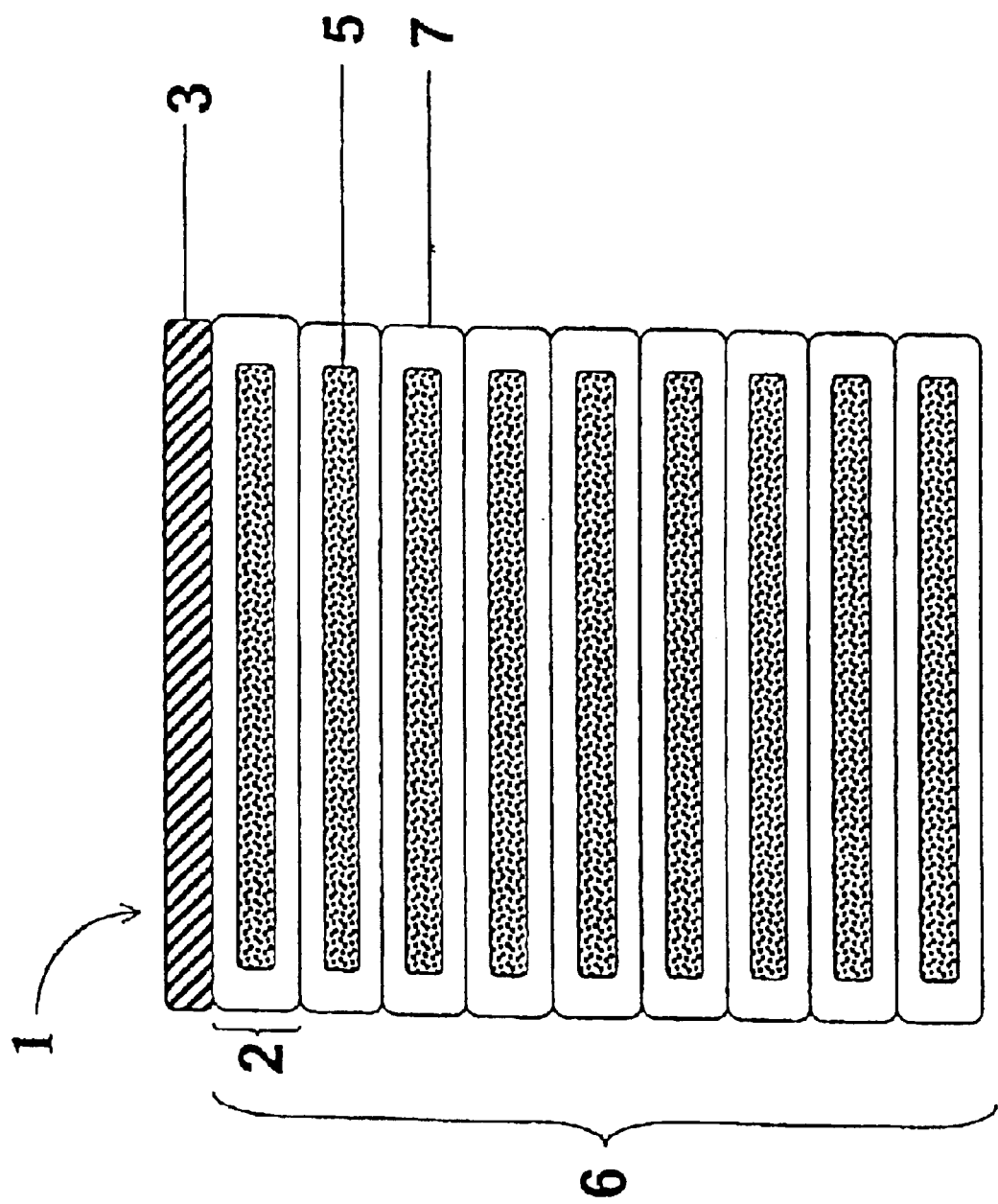
FIG. 2 is a schematic cross-section of a second embodiment of a composite superconducting tape according to the invention corresponding to a tape of FIG. 1 with the addition of a single outer metal tape.

The composite superconducting tape 1 shown in FIG. 1 has a width of between 4.0 and 5.5 mm and a thickness of about 0.27 mm and comprises, for example, nine stacked monofilamentary tapes 2 bonded together. Each monofilamentary tape 2 comprises a filament 5 of superconducting material, for example, BSCCO-2223 in a silver/silver alloy cladding 7 as with known superconducting tapes. Typically (in the finished product as shown) each individual monofilamentary tape 2 has a thickness of 30 $\mu$m and the filaments 5 themselves have typical thicknesses of 10 to 25 $\mu$m.

To make the composite superconducting tape 1, the required number of mono filamentary tapes 2 must be made. The monofilamentary tapes 2 are made by firstly packing BSCCO-2223 oxide powder (or more usually a precursor convertible to the BSCCO-2223 composition by heat-treatment) into a cleaned and dry tube of silver or silver alloy having an internal diameter of approximately 8 mm and an external diameter of approximately 10 mm. A length of between 4 cm and 6 cm—depending upon the length of the silver tube—at one end of the tube is then swagged, and the tip of the swagged end closed off using smaller swagging dies, to prevent powder loss during packing. After swagging, the tube is again dried. The prepared tube is then carefully filled with the superconducting powder (precursor) under dry argon in a glove box. The powder is added small amounts at a time and tamped down with a silver rod until the tube is full, at which point the tube is closed off using a plug of silver tape. After the tube has been packed with superconducting powder and sealed, then the tube is degassed by placing it in a coot oven, in air, raising the temperature to 830° C. and maintaining that temperature for five hours. The tube is then drawn in a number of stages down to a diameter of approximately 1.54 mm. The drawing is done in 23 steps in each of which the cross-sectional area of the tube is reduced by approximately 15%. During drawing, the tube is twice annealed at 500° C. for between 30 and 60 seconds, when its diameter is 2.51 mm and 1.96 mm respectively.

The 1.54 mm wire is then rolled in a rolling mill in stages, to successive smaller thicknesses using roll gaps of 1,05, 0.80, 0.65, 0.50, 0.40, 0.35, 0.30, 0.25 and 0.22 mm, twice annealing for between 30 and 60 seconds at 500° C., at thicknesses of 0.65 mm and 0.35 mm.

The tape 2 is then cut into strips of equal length and stacked one upon each other and the stack 6 of tapes 2 wound on a former of ceramic material (with a ceramic paper strip interleaved to prevent bonding of turns). The tapes 2 are then heated at 820° C. for about five hours to effect diffusion bonding and then, after it has cooled to room temperature, rolled in stages to 0.30 mm using successive roll gaps of 1.50, 1.30, 1.1 0, 0.95, 0.80, 0.65, 0.55, 0.45, 0.40, 0.35 and 0.30 mm and annealing under the same conditions as before at 1.10 mm and 0.65 mm.

The tape 1 is then heated in air, starting with a cool oven, to 840° C. and held at that temperature for 50 hours, cooled to room temperature and rolled once on the same mill with a roll gap of 0.27 mm. Finally it is heat-treated in an atmosphere of 7.5% oxygen balance nitrogen, starting with a cold oven, heated to 825° C., held at that temperature for 40 hours and then cooled over a further period of 40 hours to 785° C. This heat-treatment regime serves to consolidate it, complete texturing and convert the precursor to the desired BSCCO-2223 phase without risking melting or any large volume fraction of the superconducting material.

The embodiment described above has used nine monofilamentary tapes 2 and a final thickness between 0.25 and 0.3 mm. However, more or fewer tapes can be used and the thickness varied depending upon the application of the composite super conducting tape 1, such as high load current carrying cables, its thickness and the extent of subsequent rolling, and the relevant (but conflicting) requirements for capacity and flexibility. In most cases the balance of thicknesses and rolling reduction should be such that the filament thickness is generally in the range 10–40 $\mu$m, but preferably close to the lower end of that range.

Figure 3:
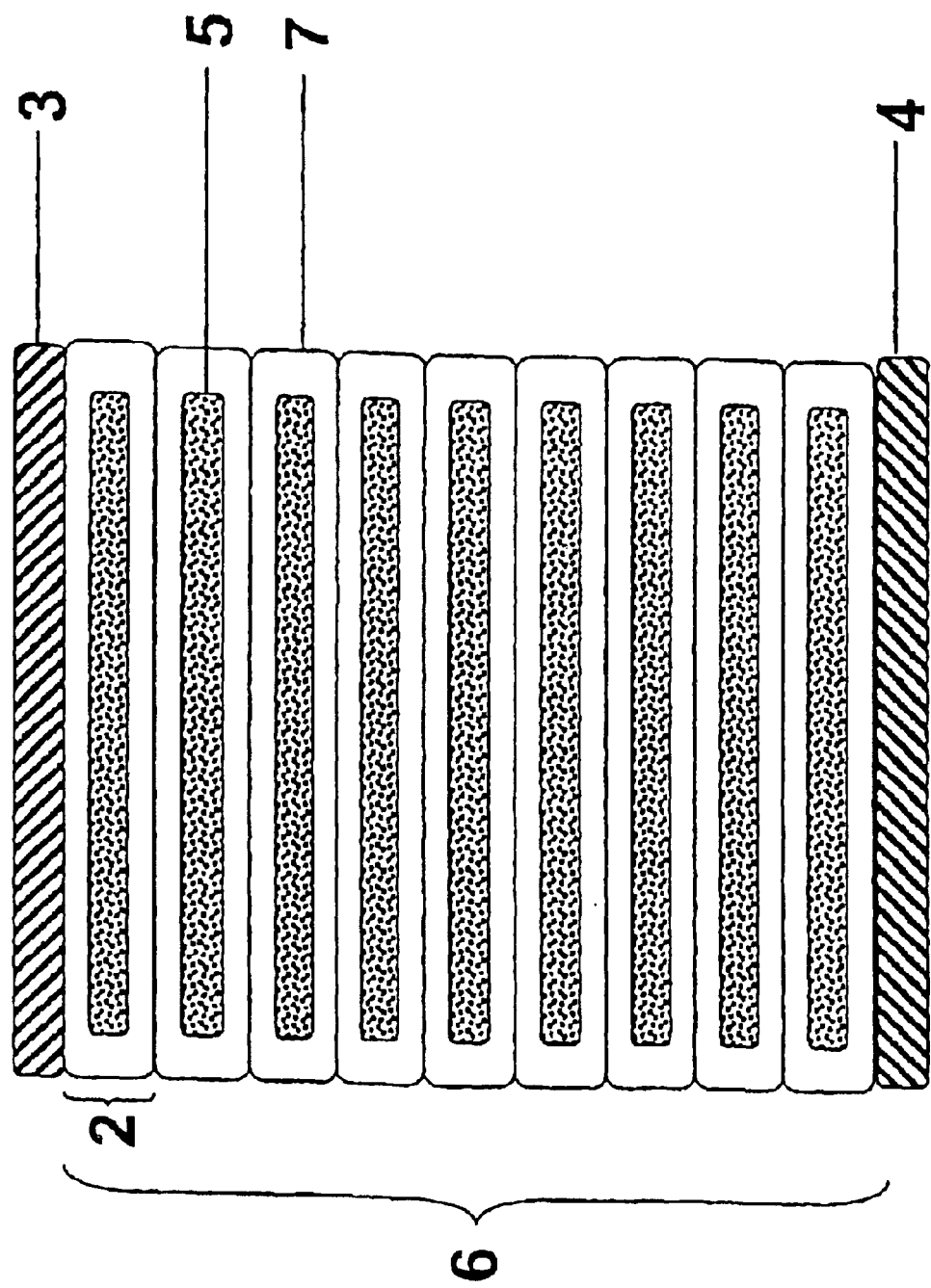
FIG. 3 is a cross-section of a third embodiment of a composite superconducting tape of the present invention corresponding to a tape of FIG. 1 with the addition of two outer tapes.

In an alternative embodiment, illustrated in FIG. 3, the stack 1 has outer layers 3 and 4 of tapes of silver or silver alloy—typically comprising silver with 0.2% Magnesium—bonded to the two outer superconducting tapes. In this case, the outer layers 3 and 4 of silver or silver alloy about 0.22 mm thick are placed on the stack 6 of monofilamentary tapes 2 before the sintering and rolling processes and at the end of the process have thicknesses of about 25 $\mu$m.

The outer layers 3 and 4 can be provided for a number of reasons.

Firstly, if the final composite tape is made sufficiently thin that the distance between the tape surface (metal/atmosphere) interface and the outermost silver or silver alloy/superconductor interface of silver cladding 7 becomes less than around 10 microns, is then diffusion of the superconducting material to the tape surface occurs during the sintering process, which reduces the critical current density. If this is the case, then placing an extra layer of silver/silver alloy effectively increases the value of $t_0$, thereby removing this diffusion effect.

Secondly, outer layers 3 and/or 4 can be provided for mechanical reasons; if the material of the outer layer(s) is chosen to have a higher coefficient of thermal expansion than the superconductor tapes, it will put the filaments under compressive stress after the sintering process, which is beneficial for higher bending and tensile strain tolerance. In addition, it is possible to use a relatively strong tape (such as a silver alloy tape) on one side and a relatively weak one (such as pure silver one of similar thickness or a much thinner one) or in some cases none at all on the other side of the composite tape, so that the flexural neutral plane is displaced from its geometrical midplane towards the stronger tape. The result is that, when the tape is curved in such a direction that the side with the stronger tape (or the tape if there is only one) is convex, most of the filaments will be under compressive strain, which is less detrimental than tensile strain. This is useful, since in many applications the tape will be curved entirely in one direction.

Figure 4:
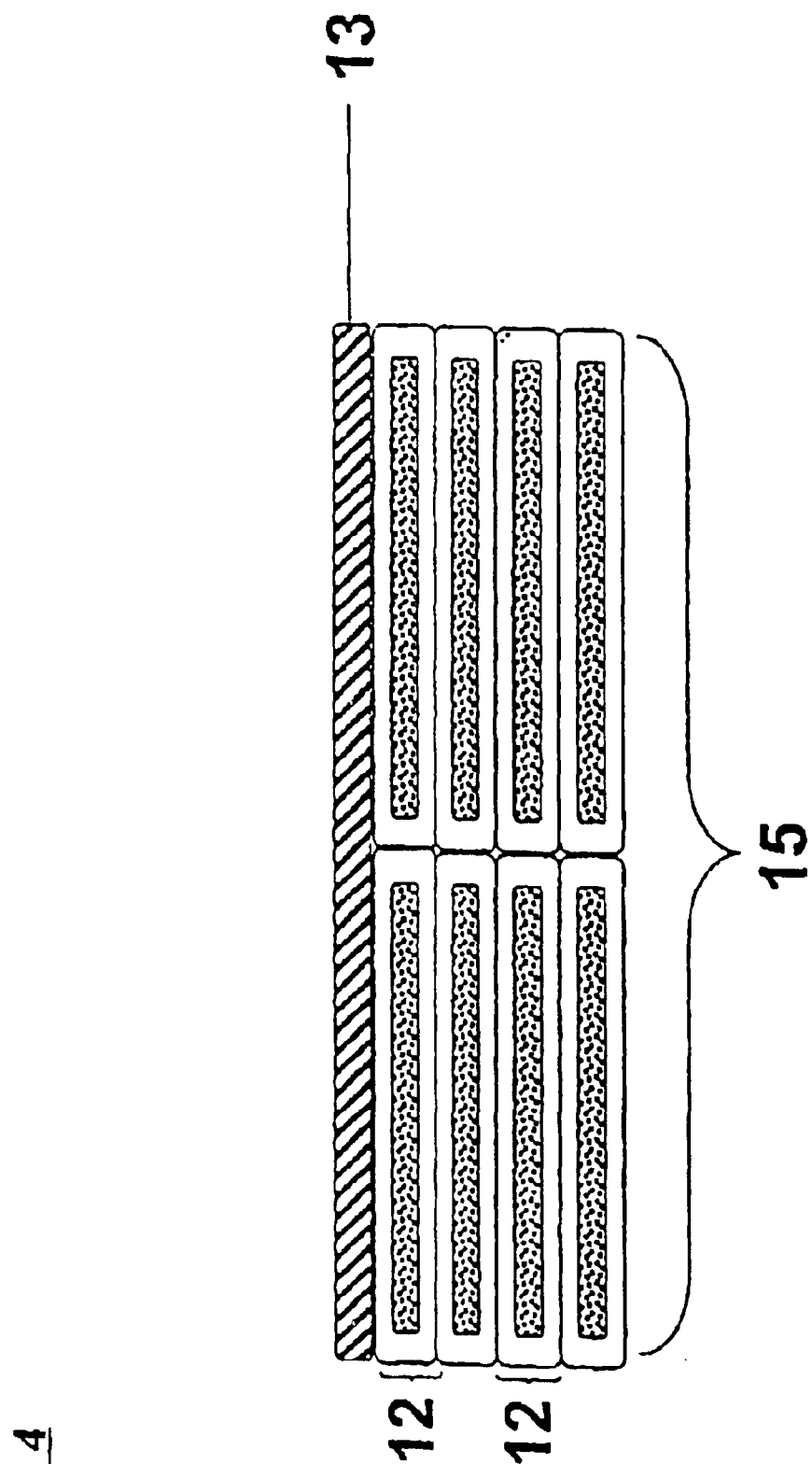
FIG. 4 illustrates a fourth embodiment of the invention and is a cross-section of a multi-column, composite superconducting tape of the present invention with single outer tape.
Figure 5:
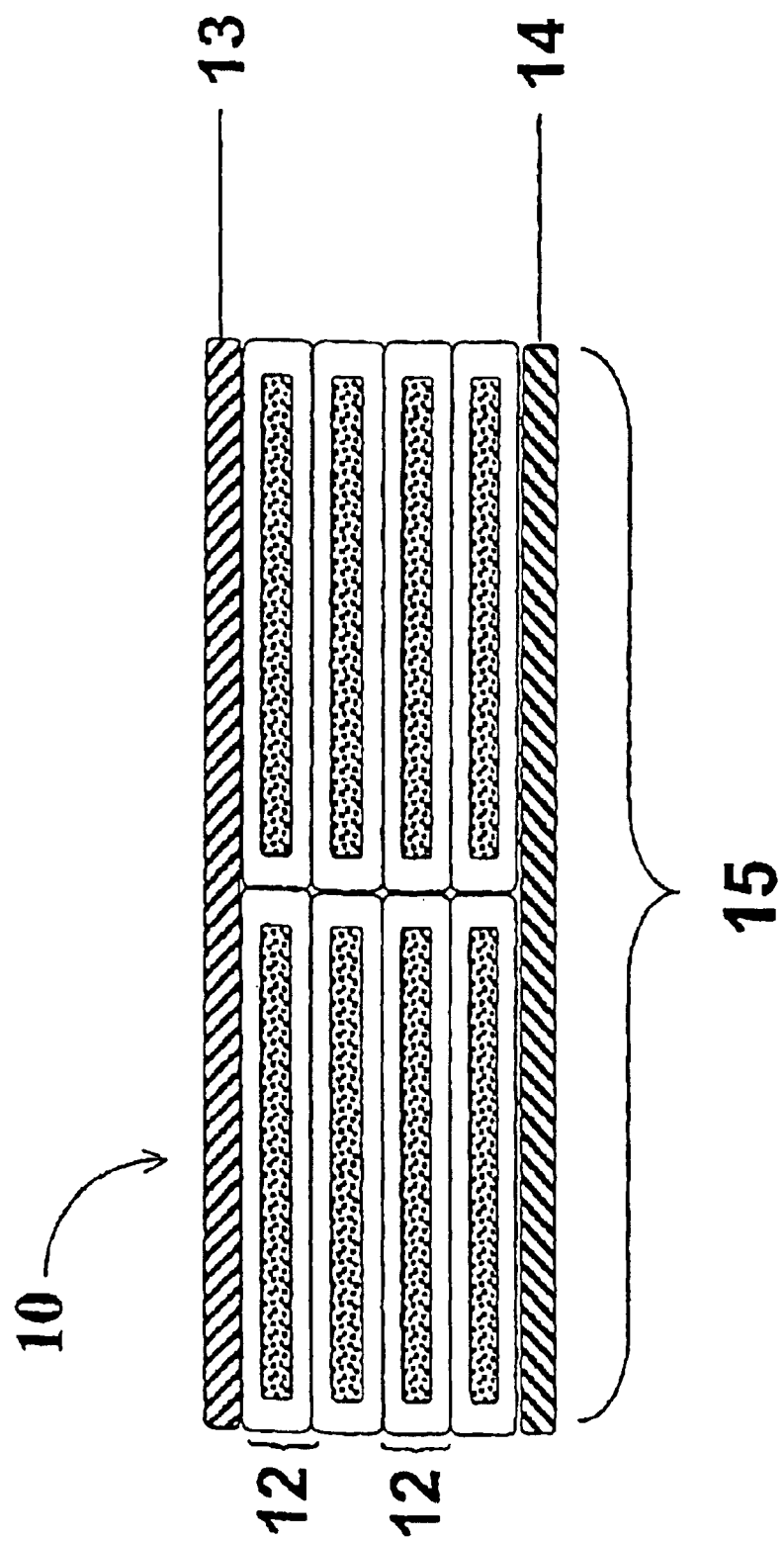
FIG. 5 illustrates a fifth embodiment of the invention and is a cross-section of a multi-column, composite superconducting tape of the present invention with two outer tapes.

In a further development of the invention, multi-column tapes 10 can be provided, as illustrated schematically in FIGS. 4 and 5. As with the previous embodiments, outer layers 13 and 14 may be either of silver and/or silver alloy, or they might if desired be double-width superconducting tapes. Monofilamentary tapes 12 are stacked in two or more columns 15, and then all the layers 12, 13 and 14 bonded together and further processed in the same way as described with respect to the first embodiment. Preliminary experiments indicate that this columnar structure has lower AC losses than comparable single-column tapes, perhaps because the filaments decouple across the columns. It may be desirable to square the edges of the tapes (by trimming or otherwise) to minimise the risk of creating voids between the columns.

Figure 6:
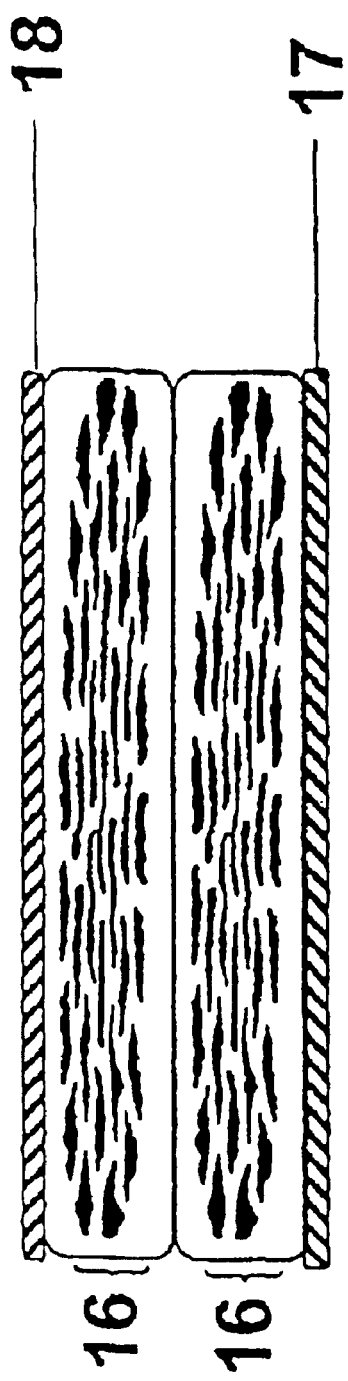
FIG. 6 is a cross-section of a sixth embodiment of a composite superconducting tape of the present invention, consisting of two multifilmentary superconducting tapes and two outer metal tapes.

The tape of FIG. 6 is consisted of two multifilmentary superconducting tapes 16 and two outer metal tapes 17 and 18. Multifilamentary superconducting tape is made by building the required number of monofilamentary tapes, putting them into another silver or silver alloy tube, drawing to smaller sized wire and the rolling to flat tape using similar procedure described with respect to the first embodiment.

Twisted (or untwisted) multifilmentary tapes, if desired with different numbers of filaments, different pitches and/or different twisting sense or direction, could also be stacked and bonded together and provided with or without the outer layers of silver/silver alloy.

Although the invention has been described with reference to specific examples it will be appreciated by those skilled in the art that it may be embodied in many other forms.

What is claimed is:

1. A composite superconducting tape comprising a multiplicity of stacked and diffusion-bonded superconducting tapes and in which all elongate components extend longitudinally, and a compatible metal tape bonded to at least one exposed major surface of the superconducting tapes.

2. A composite superconducting tape according to claim 1, wherein the metal tape is silver and establishes a thickness of silver of at least 10 $\mu$m between an exposed surface thereof and any superconductive filament within the superconducting tapes.

3. A composite superconductor tape according to claim 1, having compatible metal tapes of different strengths on two exposed major surfaces thereof.

4. A composite superconducting tape according to claim 1, wherein the superconducting tapes are tacked in at least two parallel stacks.

5. A composite superconducting tape constructed from a plurality of elongate superconducting tapes which each include at least one major surface, the composite superconducting tape comprising:

a diffusion-bonded stack of the plurality of superconducting tapes in which all elongate components extend longitudinally and in which at least one of the major surfaces is exposed; and a compatible metal tape bonded to the at least one exposed major surface.

6. A composite superconducting tape according to claim 5, wherein the plurality of superconducting tapes each include at least one superconductive filament and an outer casing of predominantly silver for both containing the filaments and defining a major surface, the metal tape including a first surface for abutting the at least one exposed major surface and a second surface opposite the first surface.

7. A composite superconducting tape according to claim 6, wherein the metal tape is silver and a distance between the second surface and a closest filament of the adjacent superconducting tape is at least 10 $\mu$m.

8. A composite superconducting tape according to claim 5, wherein the stack includes a second exposed major surface and the composite superconductor tape includes a second compatible metal tape which is bonded to the second exposed major surface.

9. A composite superconducting tape according to claim 8, wherein the first and second metal tapes differ in at least one characteristic.

10. A composite superconducting tape according to claim 9, wherein the differing characteristic is selected from a group consisting of thickness, strength, rigidity, width and coefficient of thermal expansion.

11. A composite superconducting tape according to claim 5, further comprising a second diffusion-bonded stack having a plurality of superconducting tapes, wherein the two stacks are maintained in a substantially parallel configuration.

12. A composite superconducting tape according to claim 5, wherein the metal tape is diffusion bonded to the exposed major surface.

* * * * *